United States Patent
Toshiyuki (10) Patent No.: US 9,407,137 B2
(45) Date of Patent: Aug. 2, 2016

(54) CHARGE PUMP CIRCUIT AND PLL CIRCUIT

(71) Applicant: TOYOTA JIDOSHA KABUSHIKI KAISHA, Toyota-shi, Aichi-ken (JP)

(72) Inventor: Ken Toshiyuki, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/680,534

(22) Filed: Apr. 7, 2015

(65) Prior Publication Data

US 2015/0340946 A1    Nov. 26, 2015

(30) Foreign Application Priority Data

May 23, 2014  (JP) ................................. 2014-107422

(51) Int. Cl.
| | |
|---|---|
| *H03L 7/06* | (2006.01) |
| *H02M 3/07* | (2006.01) |
| *H03L 7/093* | (2006.01) |
| *H03L 7/099* | (2006.01) |
| *H03L 7/089* | (2006.01) |

(52) U.S. Cl.
CPC ................. *H02M 3/07* (2013.01); *H03L 7/089* (2013.01); *H03L 7/093* (2013.01); *H03L 7/099* (2013.01)

(58) Field of Classification Search
CPC ....... H03L 7/0895; H03L 7/0896; H03L 7/18; H03L 7/0891; H03L 7/0893
USPC .................................. 327/148, 157, 534–536
See application file for complete search history.

(56) References Cited

U.S. PATENT DOCUMENTS

| | | | | |
|---|---|---|---|---|
| 5,659,588 A | * | 8/1997 | Fiedler | .................... H03L 7/093 375/376 |
| 5,734,279 A | | 3/1998 | Bereza | |
| 5,783,956 A | * | 7/1998 | Ooishi | ....................... G06F 1/10 327/143 |
| 5,801,578 A | | 9/1998 | Bereza | |
| 2003/0042949 A1 | | 3/2003 | Si | |
| 2004/0130364 A1 | | 7/2004 | Suzuki | |
| 2008/0048722 A1 | | 2/2008 | Suzuki | |
| 2009/0206893 A1 | | 8/2009 | Terauchi | |

FOREIGN PATENT DOCUMENTS

| | | |
|---|---|---|
| JP | H10-154931 A | 6/1998 |
| JP | 2002-185290 A | 6/2002 |
| JP | 2004-208142 A | 7/2004 |
| JP | 2007-295180 A | 11/2007 |
| JP | 2008-054034 A | 3/2008 |
| JP | 2009-200703 A | 9/2009 |
| JP | 2011-130518 A | 6/2011 |
| JP | 2012-003678 A | 1/2012 |

\* cited by examiner

*Primary Examiner* — Lincoln Donovan
*Assistant Examiner* — Diana J Cheng
(74) *Attorney, Agent, or Firm* — Oliff PLC (57) ABSTRACT

A charge pump circuit includes a constant current circuit configured to have one terminal connected with a power source node; a first node configured to input or output a current; a second node configured to be set to have a potential difference with the first node being less than or equal to a predetermined value; a first transistor configured to have one terminal connected with the first node; a second transistor configured to have one terminal connected with the second node, and to operate inverse to an operation of the first transistor; and a third transistor configured to be connected between a connection node, to which another terminal of the first transistor and another terminal of the second transistor are connected, and another terminal of the constant current circuit. The third transistor has a gate connected with a constant voltage source, and functions as a constant current source.

8 Claims, 6 Drawing Sheets

Related Art

CHARGE PUMP CIRCUIT AND PLL CIRCUIT

FIELD

The disclosures herein generally relate to a charge pump circuit and a PLL circuit.

BACKGROUND

A charge pump circuit has been known that is used in a PLL (Phase Locked Loop) circuit generating a high clock frequency signal by multiplying an input clock frequency by a certain ratio (see, for example, Patent Document 1).

Figure 1:
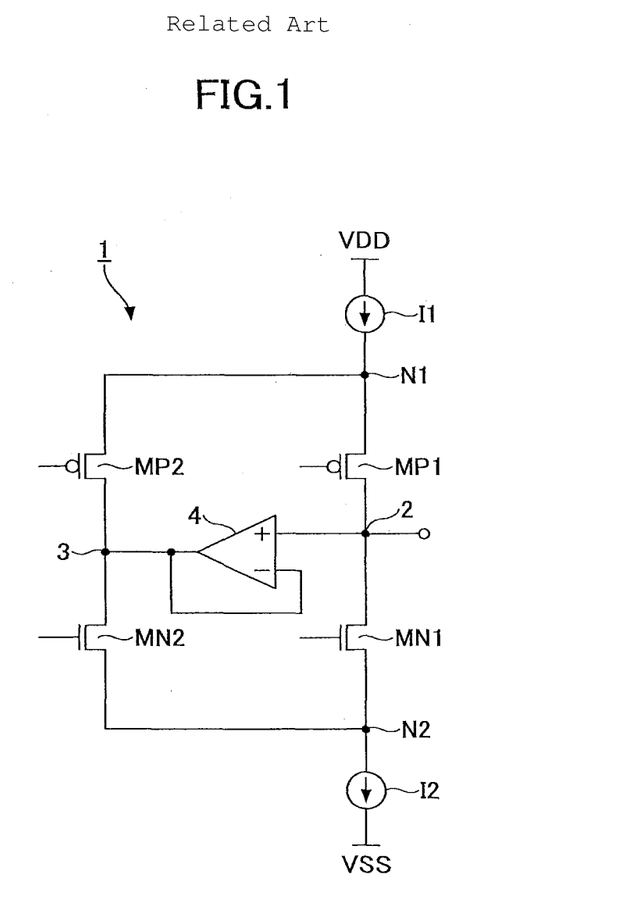
FIG. 1 is a configuration diagram illustrating a charge pump circuit disclosed in Patent Document 1.

FIG. 1 is a configuration diagram illustrating a charge pump circuit disclosed in Patent Document 1. The charge pump circuit 1 includes a constant current source I1 connected with a potential VDD, and a constant current source 12 connected with a potential VSS. When a pMOS transistor MP1 turns on, the charge pump circuit 1 discharges a current to a loop filter at the following stage from the constant current source I1 via a node 2, and when a nMOS transistor MN1 turns on, the charge pump circuit 1 draws a current into the constant current source 12 from the loop filter at the following stage via the node 2. Also, the charge pump circuit 1 includes a pMOS transistor MP2 that operates inverse to an operation of the pMOS transistor MP1, and an nMOS transistor MN2 that operates inverse to an operation of the nMOS transistor MN1.

When one of the pMOS transistors MP1 and MP2 turns on, if the potential of the node N1 fluctuates, an error difference is generated in the constant current of the constant current source I1. Similarly, when one of the nMOS transistors MN1 and MN2 turns on, if the potential of the node N2 fluctuates, an error difference is generated in the constant current of the constant current source 12. To reduce these error differences, the charge pump circuit 1 makes the voltage of the node 2 and the voltage of the node 3 equivalent to each other by an amplifier 4, to have the node N1 always take a constant potential, and to have the node N2 always take a constant potential.

RELATED-ART DOCUMENTS

Patent Documents

[Patent Document 1] Japanese Laid-open Patent Publication No. 2011-130518

However, in the conventional technology, to make the voltage of the node 2 and the voltage of the node 3 equivalent to each other, the output of the amplifier 4 is connected with its input as feedback. Therefore, there are cases where a potential difference is generated between the node 2 and the node 3, due to an offset of the amplifier 4 and a delayed followability.

Therefore, when one of the pMOS transistors MP1 and MP2 turns on, and the other turns off, if the potential of the node N1 fluctuates due to the potential difference between the node 2 and the node 3, the voltage between both terminals of the constant current source I1 continues to fluctuate, and hence, an error difference generated in the constant current of the constant current source I1 may not be sufficiently reduced.

Similarly, when one of the nMOS transistors MN1 and MN2 turns on, and the other turns off, if the potential of the node N2 fluctuates due to the potential difference between the node 2 and the node 3, the voltage between both terminals of the constant current source 12 continues to fluctuate, and hence, an error difference generated in the constant current of the constant current source 12 may not be sufficiently reduced.

Thereupon, it is an object of the present invention to provide a charge pump circuit and a PLL circuit that can suppress fluctuation of the voltage between both terminals of a constant current circuit when the operations of transistors are inverted.

SUMMARY

According to at least one embodiment of the present invention, a charge pump circuit includes a constant current circuit configured to have one terminal connected with a power source node; a first node configured to input or output a current; a second node configured to be set to have a potential difference with the first node being less than or equal to a predetermined value; a first transistor configured to have one terminal connected with the first node; a second transistor configured to have one terminal connected with the second node, and to operate inverse to an operation of the first transistor; and a third transistor configured to be connected between a connection node, to which another terminal of the first transistor and another terminal of the second transistor are connected, and another terminal of the constant current circuit, wherein the third transistor has a gate connected with a constant voltage source, and functions as a constant current source.

According to at least one embodiment of the present invention, it is possible to suppress fluctuation of the voltage between both terminals of a constant current circuit when the operations of transistors are inverted because the voltage of the other terminal of the constant current circuit is stable even if the potential of the connection node fluctuates.

DESCRIPTION OF EMBODIMENTS

Figure 2:
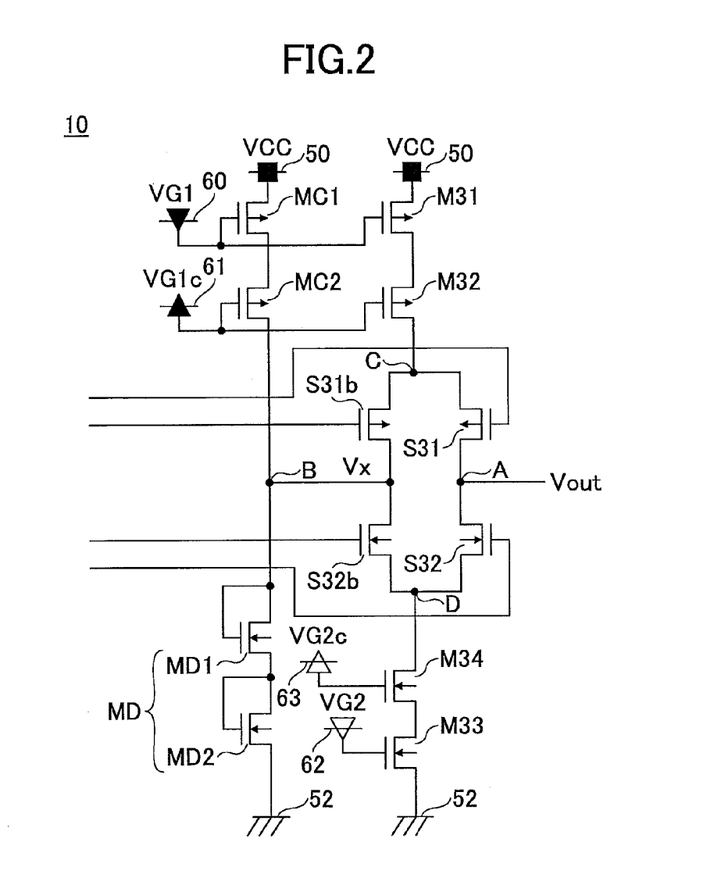
FIG. 2 is a configuration diagram illustrating an example of a charge pump circuit according to an embodiment.

FIG. 2 is a configuration diagram illustrating an example of a charge pump circuit (referred to as a CP circuit below) 10.

The CP circuit 10 is an example of a circuit that discharges a current to a loop filter at the following stage from a transistor M31 via a node A when a transistor S31 turns on, and draws a current into a transistor M33 from the loop filter at the following stage via the node A when a transistor S32 turns on.

The CP circuit 10 includes the transistor M31, the node A, the node B, the transistor S31, a transistor S31b, and a transistor M32.

The transistor M31 is an example of a constant current circuit that has one terminal connected with a power source node 50. The transistor M31 is, for example, a p-channel MOS transistor that operates as a constant current source, and has its source connected with the power source node 50, and its gate connected with a constant voltage source 60.

The power source node 50 is an example of a power source node that outputs a direct-current power supply voltage VCC, and is a high-power-potential part that takes a virtually constant potential. The constant voltage source 60 is an example of a constant voltage source that outputs a constant voltage VG1 lower than that of the power supply voltage VCC.

The node A is an example of a first node at which a current is input or output, and the node B is an example of a second node that is set to have a potential difference with the first node being less than or equal to a predetermined value. For example, in the case of FIG. 2, the node B is set to have a potential difference with the node A being less than or equal to a predetermined value (specifically, zero or a value in the neighborhood of zero), by transistors MC1, MC2, and MD. It is not limited to the transistors MC1, MC2, and MD that make the potential difference between the node A and the node B set to the predetermined value or lower, but it may be implemented by another configuration. The transistors MC1, MC2, and MD will be described later.

The transistor S31 is an example of a first transistor that has one terminal connected with the first node. The transistor S31 is, for example, a p-channel MOS transistor that operates as a switch, and has its drain connected with the node A.

The transistor S31b has one terminal connected with the second node, and is an example of a second transistor that operates inverse to an operation of the first transistor. The transistor S31b is, for example, a p-channel MOS transistor that operates as a switch, and has its drain connected with the node B. The transistor S31b switches from on to off when the transistor S31 switches from off to on, and switches from off to on when the transistor S31 switches from on to off.

The transistor M32 is an example of a third transistor that is connected between a connection node, to which the other terminal of the first transistor and the other terminal of the second transistor are connected, and the other terminal of the constant current circuit. The transistor M32 is connected, for example, between a connection node C and the drain of the transistor M31, and is a p-channel MOS transistor that operates as a constant current source. The transistor M32 has, for example, its source connected with the drain of the transistor M31, and its gate connected with a constant voltage source 61.

The connection node C is an example of a connection node to which the source of the transistor S31 and the source of the transistor S31b are connected. The constant voltage source 61 is an example of a constant voltage source different from the constant voltage source 60, and outputs a constant voltage VG1c, for example, lower than the constant voltage VG1 (VG1>VG1c).

The transistor M32 has its gate connected with the constant voltage source 61, and functions as a constant current source. Therefore, if the voltage Vds between the drain and source of the transistor M32 fluctuates due to fluctuation of the potential of the connection node C connected with the drain of the transistor M32, the voltage Vgs between the gate and source of the transistor M32 virtually remains constant. This is because the transistor M32 operates in a saturation region S2 (see FIG. 3) to function as a constant current source to have a constant drain current Id flow out, and hence, even though the voltage Vds fluctuates, the voltage Vgs between the gate and source of the transistor M32 is equivalent to a constant threshold voltage Vth of the transistor M32.

Figure 3:
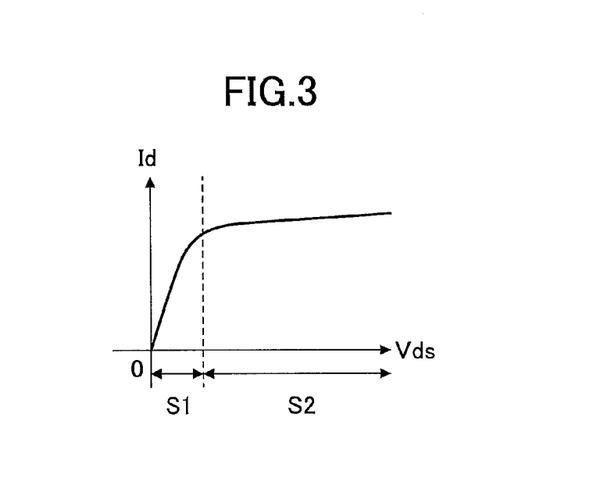
FIG. 3 is a diagram illustrating an example of a relationship between a voltage Vds between a drain and a source, and a drain current Id in a MOS (Metal Oxide Semiconductor) transistor.

Note that FIG. 3 is a diagram illustrating an example of a relationship between the voltage Vds and the drain current Id when the voltage Vgs takes a predetermined constant value (≧threshold voltage Vth). A linear region S1, in which the drain current Id increases while the voltage Vds increases, is separated from the saturation region S2, in which the drain current Id is virtually constant while the voltage Vds increases, by Vds=Vgs−Vth for values of the voltage Vgs.

Figure 4:
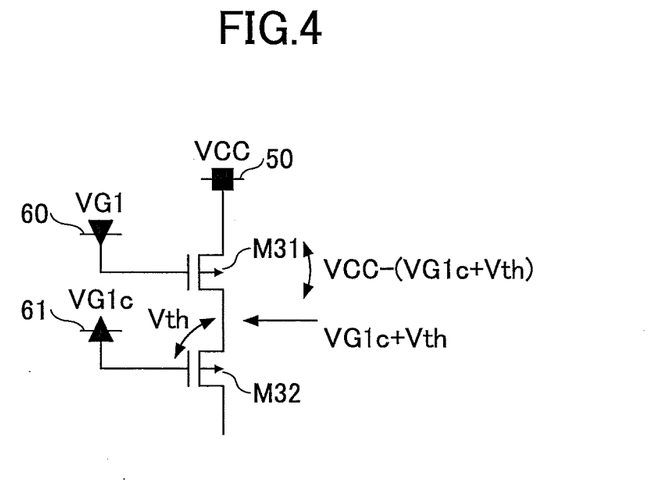
FIG. 4 is a configuration diagram illustrating a part of an example of a charge pump circuit according to an embodiment.

Therefore, as illustrated in FIG. 4, even though the potential of the drain of the transistor M32 (connection node C) fluctuates, the drain voltage of the transistor M31 takes a constant voltage value (VG1c+Vth). Therefore, the voltage Vds1 applied between both terminals, or between the drain and source of the transistor M31 is a constant voltage value (VCC−(VG1c+Vth)).

Namely, in FIG. 2, when one of the transistors S31 and S31b turns on and the other turns off, even though the potential of the connection node C fluctuates, the CP circuit 10 can suppress fluctuation of the voltage Vds1 between both terminals of the transistor M31. Consequently, when one of the transistors S31 and S31b turns on and the other turns off, for example, the CP circuit 10 can prevent the constant current that flows in the transistor M31 from fluctuating due to the fluctuation of the voltage Vds1 between both terminals of the transistor M31, and can sufficiently reduce an error difference generated in the constant current that flows in the transistor M31.

Also, in FIG. 2, the CP circuit 10 includes the transistor M33, the transistor S32, a transistor S32b, and a transistor M34.

The transistor M33 is an example of a constant current circuit that has one terminal connected with a ground node 52. The transistor M33 is, for example, an n-channel MOS transistor that operates as a constant current source, and has its source connected with the ground node 52 and its gate connected with a constant voltage source 62.

The ground node 52 is an example of a power source node that outputs a ground voltage of virtually zero, and is a low-power-potential part having a virtually constant potential. The ground node 52 is a node having a lower potential than the power source node 50. The constant voltage source is an example of a constant voltage source that outputs a constant voltage VG2 higher than the ground voltage.

The transistor S32 is an example of a first transistor that has one terminal connected with the first node. The transistor S32 is, for example, an n-channel MOS transistor that operates as a switch, and has its drain connected with the node A.

The transistor S32b has one terminal connected with the second node, is an example of a second transistor that operates inverse to an operation of the first transistor. The transistor S32b is, for example, an n-channel MOS transistor that operates as a switch, and has its drain connected with the node B. The transistor S32b switches from on to off when the transistor S32 switches from off to on, and switches from off to on when the transistor S32 switches from on to off.

The transistor M34 is an example of a third transistor connected between a connection node, to which the other terminal of the first transistor and the other terminal of the second transistor are connected, and the other terminal of the constant current circuit. The transistor M34 is, for example, connected between a connection node D and the drain of the transistor M33, and is a n-channel MOS transistor that operates as a constant current source. The transistor M34 has, for example, its source connected with the drain of the transistor M33, and its gate connected with a constant voltage source 63.

The connection node D is an example of a connection node to which the source of the transistor S32 and the source of the transistor S32$b$ are connected. The constant voltage source 63 is an example of a constant voltage source different from the constant voltage source 62, and outputs, for example, a constant voltage VG2$c$ higher than the constant voltage VG2 and lower than constant voltage VG1$c$ (VG2<VG2$c$<VG1$c$).

The transistor M34 has its gate connected with the constant voltage source 63, and functions as a constant current source. Therefore, if the voltage Vds between the drain and source of the transistor M34 fluctuates due to fluctuation of the potential of the connection node D connected with the drain of the transistor M34, the voltage Vgs between the gate and source of the transistor M34 virtually remains constant. This is because the transistor M34 operates in the saturation region S2 (see FIG. 3) to function as a constant current source to have the constant drain current Id flow out, and hence, even though the voltage Vds fluctuates, the voltage Vgs between the gate and source of the transistor M34 is equivalent to a constant threshold voltage Vth of the transistor M34.

Figure 5:
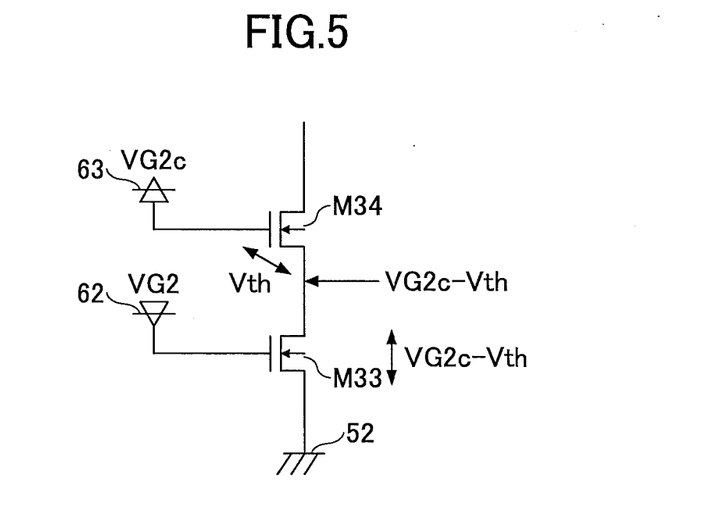
FIG. 5 is a configuration diagram illustrating a part of an example of a charge pump circuit according to an embodiment.

Therefore, as illustrated in FIG. 5, even though the potential of the drain of the transistor M34 (connection node D) fluctuates, the drain voltage of the transistor M33 takes a constant voltage value (VG2$c$-Vth). Therefore, the voltage Vds3 applied between both terminals, or between the drain and source of the transistor M33 is a constant voltage value (VG2$c$-Vth).

Namely, in FIG. 2, when one of the transistors S32 and S32$b$ turns on and the other turns off, even though the potential of the connection node D fluctuates, the CP circuit 10 can suppress fluctuation of the voltage Vds3 between both terminals of the transistor M33. Consequently, when one of the transistors S32 and S32$b$ turns on and the other turns off, for example, the CP circuit can prevent the constant current that flows in the transistor M33 from fluctuating due to the fluctuation of the voltage Vds3 between both terminals of the transistor M33, and can sufficiently reduce an error difference generated in the constant current that flows in the transistor M33.

Figure 6:
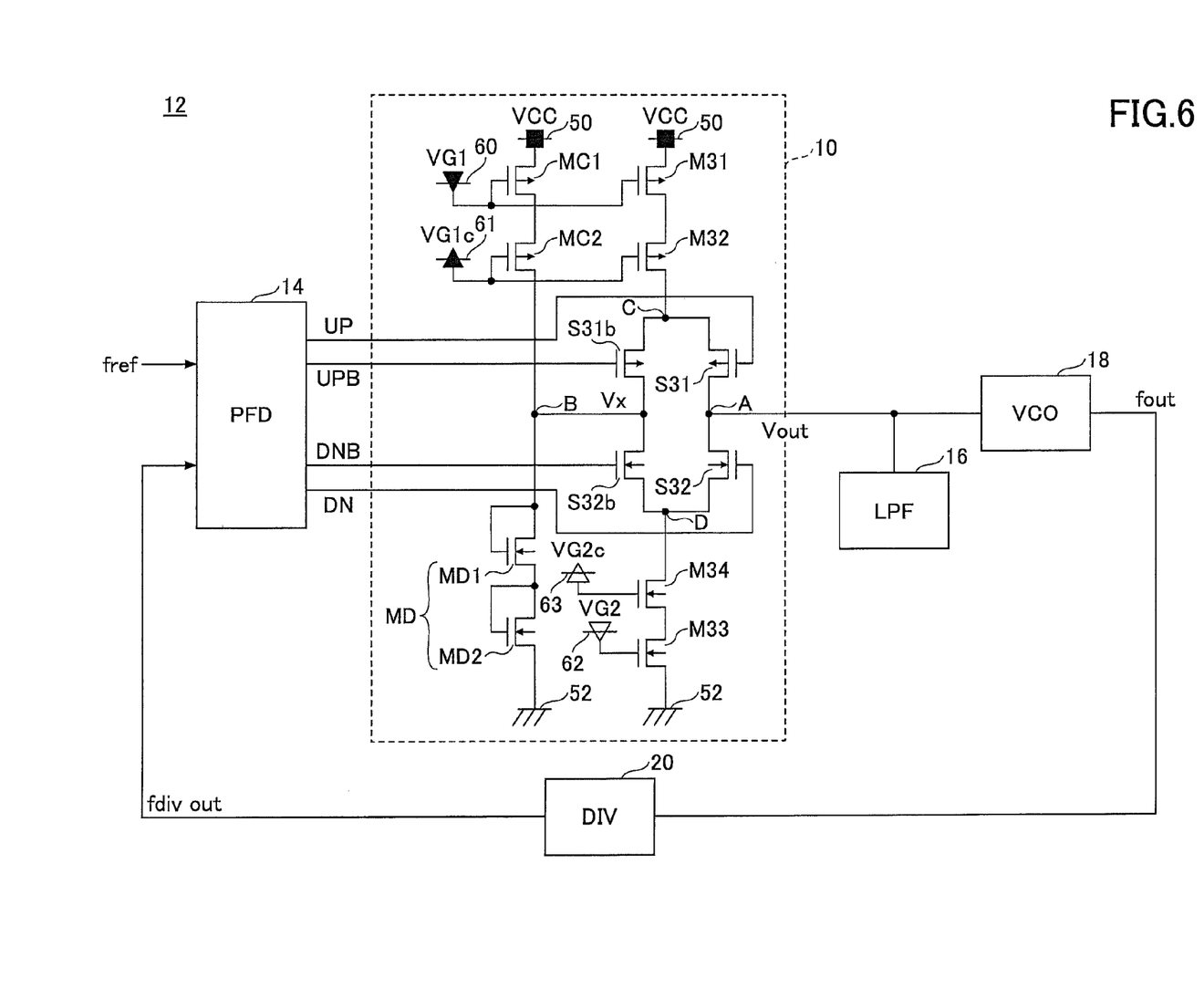
FIG. 6 is a configuration diagram illustrating an example of a PLL circuit according to an embodiment.

FIG. 6 is a configuration diagram illustrating an example of a PLL circuit 12 that includes a CP circuit 10. The PLL circuit 12 in the present embodiment is a circuit that generates a high frequency by multiplying a reference frequency transmitted from a microcomputer, which follows, for example, a trend where the frequency of a clock driving a digital circuit has become higher (several dozen MHz). As shown in FIG. 6, the PLL circuit 12 includes a PFD circuit 14, the CP circuit 10, an LPF circuit 16, a VCO circuit 18, and a DIV circuit 20.

The PFD circuit 14 is a phase/frequency comparator that compares phases and frequencies, respectively, between a reference frequency signal fref that represents a clock having a predetermined frequency (for example, 2 MHz) or lower supplied from a microcomputer, and a frequency signal fdivout that is obtained by multiplying an output frequency signal fout of the PLL circuit 12 in the present embodiment, by 1/N (where N is an integer). The PFD circuit 14 outputs phase difference signals that correspond to the phase difference between the reference frequency signal fref and the frequency signal fdivout, which are received as input.

Output terminals of the PFD circuit 14 are connected with input terminals of the CP circuit 10. The CP circuit 10 is a circuit that outputs electric charge from the node A, depending on the phase difference signals supplied from the PFD circuit 14, as will be described in detail later. The phase difference signals that are output from the PFD circuit 14 include an up signal UP to have the CP circuit 10 output a current from the node A to the outside, and a down signal DN to have the CP circuit 10 draw in a current from the outside into the node A. Depending on the up signal UP and the down signal DN supplied from the PFD circuit 14, the CP circuit 10 outputs the electric charge from the node A. Specifically, when the up signal UP takes a high level, electric charge is output to the outside via the node A, or when the down signal DN takes a high level, electric charge is drawn in from the outside via the node A.

The output terminal of the CP circuit 10 is connected with an input terminal of the LPF circuit 16 to be connected with the node A. The LPF circuit 16 is a low-pass filter mainly constituted with a resistor and a capacitor, and is a loop filter that can accumulate electric charge supplied from the CP circuit 10. The LPF circuit 16 charges or discharges depending on the input/output of electric charge by the CP circuit 10. When the LPF circuit 16 accumulates electric charge, an output voltage Vout is generated depending on an amount of the accumulated electric charge.

Figure 7:
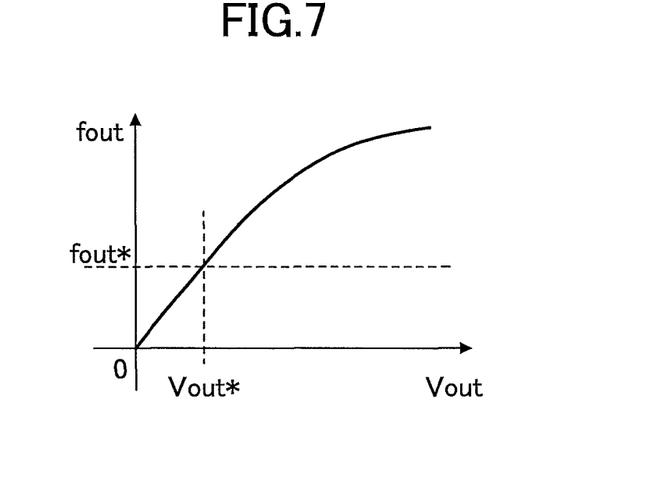
FIG. 7 is a diagram illustrating an example of a relationship between an output voltage Vout received as input and an output frequency signal fout to be output in a voltage-controlled oscillator provided in a PLL circuit according to an embodiment.

The output terminal of the CP circuit 10 is connected with an input terminal of the VCO circuit 18 to be connected with the node A. The VCO circuit 18 is a voltage-controlled oscillator that oscillates at a frequency depending on the voltage value of the output voltage Vout, which is generated by the electric charge accumulated in the LPF circuit 16. Based on the output voltage Vout from the LPF circuit 16, the VCO circuit 18 outputs a high-frequency output frequency signal fout as the output of the PLL circuit 12, which is obtained by multiplying the reference frequency signal fref input into the PLL circuit 12. Specifically, following a relationship illustrated in FIG. 7, the VCO circuit 18 outputs the output frequency signal fout having a higher frequency when the output voltage Vout is higher.

The output terminal of the VCO circuit 18 is connected with an input terminal of the DIV circuit 20. The DIV circuit 20 is a frequency divider that divides the output frequency signal fout output from the VCO circuit 18 by a predetermined division ratio N. The DIV circuit 20 outputs a frequency signal fdivout that is obtained by multiplying the output frequency signal fout from the VCO circuit 18 by 1/N. The frequency signal fdivout output by the DIV circuit 20 is supplied to the PFD circuit 14 described above.

As described above, the CP circuit 10 includes the transistors S31, S31$b$, S32, and S32$b$.

The transistor S31 has its gate receive the up signal UP supplied from the PFD circuit 14 as input, and turns on and off depending on the logic level of the up signal UP. The transistor S31 turns off when the up signal UP takes the high level, and turns on when the up signal UP takes the low level.

The transistor S31$b$ has its gate receive an inverted signal UPB supplied from the PFD circuit 14 as input, and turns on and off depending on the logic level of the inverted signal UPB. The inverted signal UPB is a signal that is inverted to the logic level of the up signal UP, takes the low level when the up signal UP takes the high level, and takes the high level when the up signal UP takes the low level. The transistor S31$b$ turns off when the inverted signal UPB takes the high level, and turns on when the inverted signal UPB takes the low level.

The transistor S32 has its gate receive the down signal DN supplied from the PFD circuit 14 as input, and turns on and off depending on the logic level of the down signal DN. The transistor S32 turns on when the down signal DN takes the high level, and turns off when the down signal DN takes the low level.

The transistor S32b has its gate receive an inverted signal DNB supplied from the PFD circuit 14 as input, and turns on and off depending on the logic level of the inverted signal DNB. The inverted signal DNB is a signal that is inverted to the logic level of the down signal DN, takes the low level when the down signal DN takes the high level, and takes the high level when the down signal DN takes the low level. The transistor S32b turns on when the inverted signal DNB takes the high level, and turns off when the inverted signal DNB takes the low level.

The CP circuit 10 includes a diode MD, and the transistors MC1 and MC2. The diode MD is an example of a diode that has one terminal connected with the node B. In the illustrated case, the diode MD includes diode-connected transistors, and is a circuit that functions as a diode by the diode-connected transistors. The transistors MC1 and MC2 are an example of a current generation circuit that generates a greater constant current than the transistors M33 and M34 to flow the constant current in the diode MD.

By including the diode MD and the transistors MC1 and MC2, the CP circuit 10 can set the voltage of the node B to make the potential difference between the node A and the node B be less than or equal to a predetermined value. Also, by setting the voltage of the node B by the diode MD, when the transistor S31b turns on, even though a current flows in the diode MD via the node B, it is possible to clamp the voltage of the node B to a constant value determined by the forward voltage of the diode MD.

Also, by having the transistors MC1 and MC2 generate a greater constant current than the transistors M33 and M34, even though a current flows in the transistors M33 and M34 when the transistor S32b connected with the node B turns on, it is possible to prevent the current that flows in the diode MD, from being insufficient.

The current value of the constant current that flows in the transistor MC1 can be set to be greater than the current value of the constant current that flows in the transistor M33, for example, by making the size of the transistor MC1 greater than the size of the transistor M33. Similarly, the current value of the constant current that flows in the transistor MC2 can be set to be greater than the current value of the constant current that flows in the transistor M34, for example, by making the size of the transistor MC2 greater than the size of the transistor M34.

The transistor MC1 is an example of a constant current circuit that has one terminal connected with the same power source node 50 as the transistor M31. The transistor MC1 is, for example, a p-channel MOS transistor that functions as a constant current source, and has its source connected with the power source node 50, its gate connected with the power source node 60, and its drain connected with the source of the transistor MC2.

The transistor MC2 is an example of a constant current circuit that has its gate connected with the same constant voltage source 61 as the transistor M32. The transistor MC2 is, for example, a p-channel MOS transistor that functions as a constant current source, and has its source connected with the drain of the transistor MC1, its gate connected with the constant voltage source 61, and its drain connected with the node B.

Note that each of the transistors M31, M32, M33, M34, MC1, and MC2 operates not in the linear region S1, but in the saturation region S2 illustrated in FIG. 3, and functions as a constant current source to circulate a constant current.

The diode MD has a configuration, for example, including multiple diode-connected transistors connected in series, and is a clamp circuit that clamps the voltage of the node B to a constant value. The illustrated diode MD has a configuration including a diode-connected transistor MD1 and a diode-connected transistor MD2, which are connected in series. The transistors MD1 and MD2 are n-channel MOS transistors that have, for example, their gates and drains connected with each other (namely, diode-connected), respectively.

Simply having the diode-connected transistors connected in series can only set the voltage of the node B to an integer multiple of the threshold voltage Vth of a diode-connected transistor, but cannot set the voltage of the node B continuous to an arbitrary value. Therefore, the potential difference between the node A and the node B is shifted by (Vth/2) at the maximum. However, even if the potential difference between the node A and the node B is shifted by (Vth/2) at the maximum, the potential difference is absorbed by the voltage Vds between the drain and source of the transistors M32 and M34, and hence, it is possible to suppress fluctuation of the voltage Vds1 between both terminals of the transistor M31, and the voltage Vds3 between both terminals of the transistor M33.

Representing the threshold voltage of a diode-connected transistor by Vth, and representing the input voltage of the VCO circuit 18 when the output frequency signal fout of the VCO circuit 18 is equivalent to a target frequency fout* (=an output target value of the PLL circuit 12), by Vin*(=output voltage Vout* of the LPF circuit 16), the number of diode-connected transistors that are connected in series in the diode MD, may be selected as a positive integer n that satisfies Formula 1 below.

$$(n-0.5)\times Vth < Vin^* < (n+0.5)\times Vth \qquad \text{Formula 1}$$

By selecting the number n that satisfies Formula 1, the potential difference between the node A and the node B can be minimized. Note that n=2 in the illustrated case.

Figure 8:
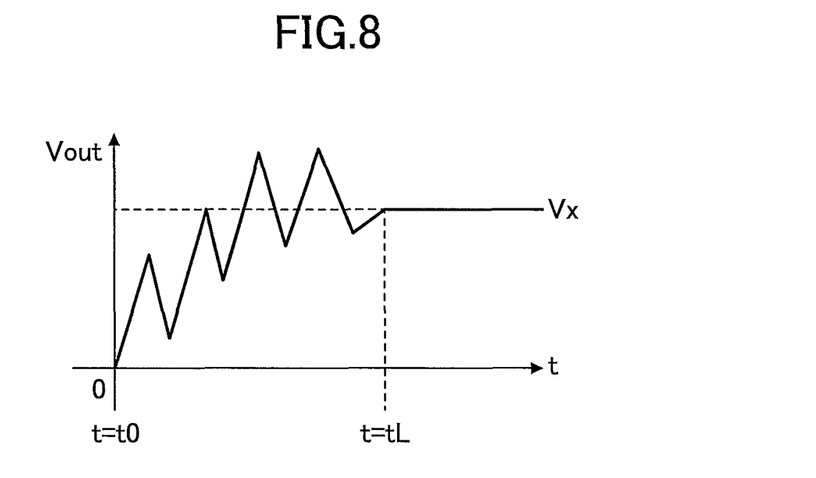
FIG. 8 is a diagram illustrating an example of a time waveform of an output voltage Vout received as input in a voltage-controlled oscillator provided in a PLL circuit since the PLL circuit has activated according to an embodiment.

FIG. 8 is a diagram illustrating an example of a time waveform of the input voltage Vin of the VCO circuit 18 (namely, the output voltage Vout of the LPF circuit 16) provided in the PLL circuit 12 since its activation (time t=t0).

When the PLL circuit 12 is activated (time t=t0 and after), the output frequency signal fout is lower than the target frequency fout* for the moment. Therefore, the CP circuit 10 feeds electric charge to the LPF circuit 16 to have the LPF circuit 16 charged, and the output voltage Vout gradually rises. Then, when the output frequency signal fout becomes higher than the target frequency fout*, the CP circuit 10 draws in the electric charge of the LPF circuit 16 to have the LPF circuit 16 discharged, and the output voltage Vout gradually reduces. By repeating the rise and fall of the output voltage Vout, the output frequency signal fout stabilizes in the neighborhood of the target frequency fout*. Then, the output frequency signal fout is locked in the neighborhood of the target frequency fout*, by stably maintaining the output voltage Vout in the neighborhood of the desired output voltage Vout*.

After the frequency lock has started (time t=tL and after), the oscillation frequency is finely adjusted in the PLL circuit 12. Specifically, the CP circuit 10 has the transistors S31, S31b, S32, and S32b execute switching operations as follows.

Figure 9:
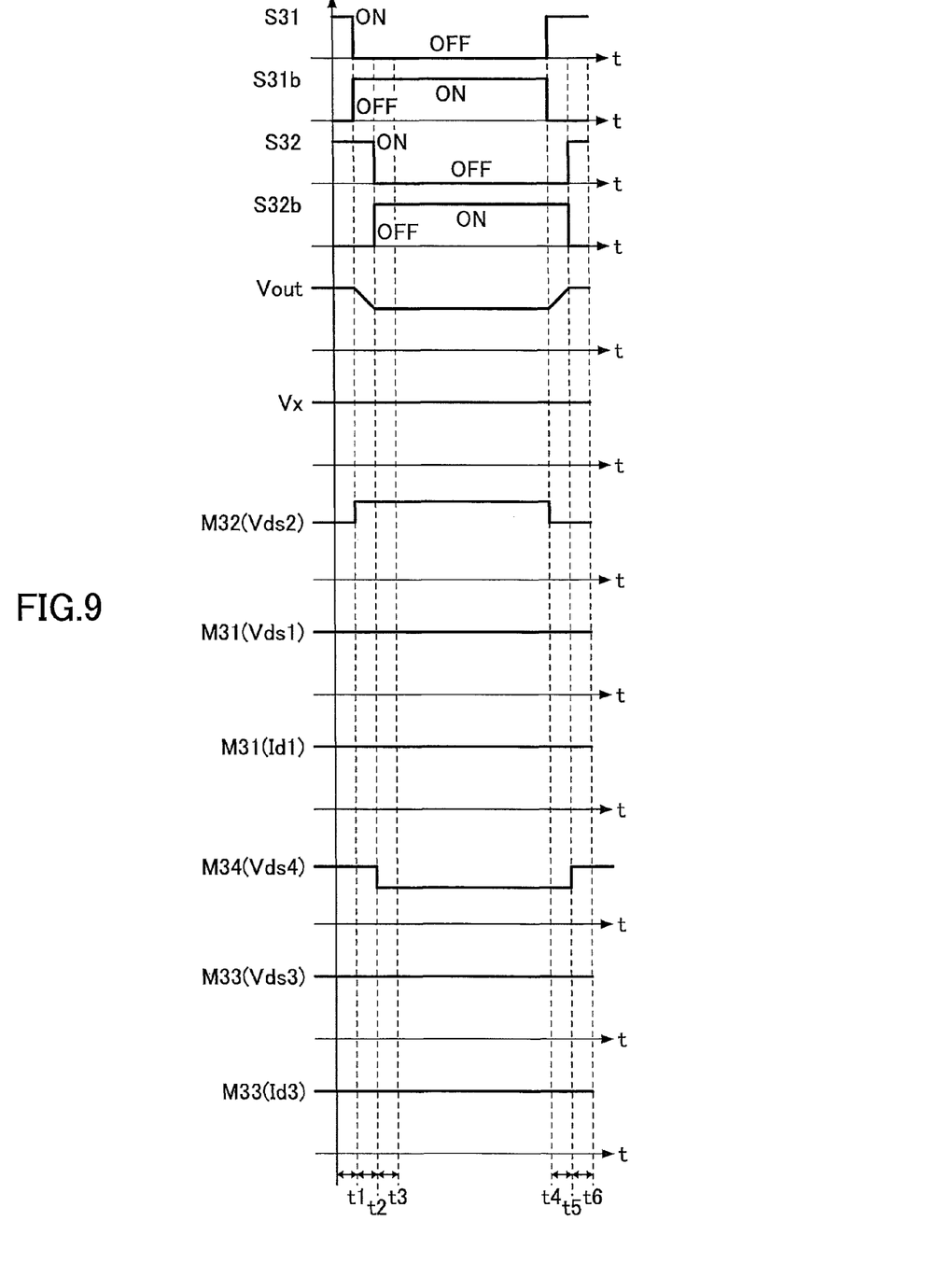
FIG. 9 is a timing chart illustrating an example of operations of a charge pump circuit according to an embodiment.

FIG. 9 is a timing chart illustrating an example of operations of the CP circuit 10 provided in the PLL circuit 12.

First, to stably maintain the output voltage Vout to make the output frequency signal fout fixed, in a state where both the transistor S31 and the transistor S32 turn on, the transistor S31 switches from on to off to slightly reduce the output voltage Vout (time t1).

When the transistor S31 switches from on to off while the transistor S32 remains turned on, the transistor S31b switches from off to on at the same time. When the switching occurs, the voltage between the source of the transistor M31 and the drain of the transistor M32 changes from a voltage difference between the power supply voltage VCC and the output voltage Vout (VCC−Vout), to a voltage difference between the power supply voltage VCC and the voltage Vx at the node B (VCC−Vx).

When the switching occurs at time t1, the drain voltage of the transistor M31 remains unchanged at (VG1c+Vth), and hence, the potential difference between the node A and the node B (Vout−Vx) is absorbed as a rise amount of the voltage Vds2 between the drain and source of the transistor M32.

Therefore, before and after the switching at time t1, fluctuation of the voltage Vds1 between both terminals of the transistor M31 can be suppressed, and hence, change of the constant drain current Id1 that flows in the transistor M31 can be kept small.

Also, when the transistor S31b switches from off to on as described above, the transistor S32b remains off. In this case, after the switching, the constant drain current Id1 that flows in the transistor M31 flows into the diode MD via the node B. However, the voltage Vx of the node B is clamped to the threshold of the diode MD (in this case, 2×Vth), and hardly changes.

Next, the transistor S32 switches from on to off while the transistor S31 remains turned off (time t2).

When the transistor S32 switches from on to off while the transistor S31 remains turned off, the transistor S32b switches from off to on at the same time. When the switching occurs, the voltage between the source of the transistor M33 and the drain of the transistor M34 changes from a voltage difference between the output voltage Vout and the ground voltage (namely, Vout), to a voltage difference between the voltage Vx at the node B and the ground voltage (namely, Vx).

When the switching occurs at time t2, the drain voltage of the transistor M33 remains unchanged at (VG2c−Vth), and hence, the potential difference between the node A and the node B (Vx−Vout) is absorbed as a fall amount of the voltage Vds4 between the drain and source of the transistor M34. Therefore, before and after the switching at time t2, fluctuation of the voltage Vds3 between both terminals of the transistor M33 can be suppressed, and hence, change of the constant drain current Id3 that flows in the transistor M33 can be kept small.

Also, when the transistor S32b switches from off to on as described above, the transistor S31b remains on. In this case, after the switching, the drain current Id1 flowing out of the transistor M31 flows in the transistor S31b, and the drain current Id2 flowing into the transistor M33 flows in the transistor S32b, which makes the drain current Id1 and the drain current Id2 cancel each other. Therefore, virtually no current flows from the node B side to the transistor MD side, and hence, the voltage Vx of the node B hardly changes after time t2 and t3 due to the current that flows in the diode MD from the transistors MC1 and MC2.

Next, in a state where both the transistor S31b and the transistor S32b turn on, the transistor S31b switches from on to off, and the transistor S31 switches from off to on to slightly increase the output voltage Vout (time t4).

When the switching occurs, the voltage between the source of the transistor M31 and the drain of the transistor M32 changes from a voltage difference between the power supply voltage VCC and the voltage Vx at the node B (VCC−Vx), to a voltage difference between the power supply voltage VCC and the output voltage Vout (VCC−Vout).

When the switching occurs at time t4, the drain voltage of the transistor M31 remains unchanged at (VG1c+Vth), and hence, the potential difference between the node A and the node B (Vx−Vout) is absorbed as a fall amount of the voltage Vds2 between the drain and source of the transistor M32. Therefore, before and after the switching at time t4, fluctuation of the voltage Vds1 between both terminals of the transistor M31 can be suppressed, and hence, change of the constant drain current Id1 that flows in the transistor M31 can be kept small.

Also, when the transistor S31b switches from on to off as described above, the transistor S32b remains on. In this case, after the switching, the current from the transistors MC1 and MC2 flows into the transistor M33 via the node B. However, since the current flowing in the transistors MC1 and MC2 is greater than the current flowing in the transistor M33, the current from the transistors MC1 and MC2 also flows into the diode MD. Therefore, the threshold of the diode MD generated at the node B (in this case, 2×Vth) is maintained.

Next, the transistor S32 switches from off to on while the transistor S31 remains turned on (time t5).

When the transistor S32 switches from off to on while the transistor S31 remains turned on, the transistor S32b switches from on to off at the same time. When the switching occurs, the voltage between the source of the transistor M33 and the drain of the transistor M34 changes from a voltage difference between the voltage Vx at the node B and the ground voltage (namely, Vx), to a voltage difference between the output voltage Vout and the ground voltage (namely, Vout).

When the switching occurs at time t5, the drain voltage of the transistor M33 remains unchanged at (VG2c−Vth), and hence, the potential difference between the node A and the node B (Vout−Vx) is absorbed as a rise amount of the voltage Vds4 between the drain and source of the transistor M34. Therefore, before and after the switching at time t5, fluctuation of the voltage Vds3 between both terminals of the transistor M33 can be suppressed, and hence, change of the constant drain current Id3 that flows in the transistor M33 can be kept small.

Also, when the transistor S32b switches from on to off as described above, the transistor S31b remains off. In this case, after the switching, virtually no electric charge flows into the diode MD from the transistors M31 and M33, and hence the voltage Vx of the node B hardly changes after time t5 and t6 due to the current that flows in the transistor MD from the transistors MC1 and MC2.

In this way, in the PLL circuit 12 in the present embodiment, the PFD circuit 14 generates control signals (the up signal UP, the down signal DN and the like) based on the phase difference between the reference frequency signal fref, and the frequency signal fdivout, which is obtained by dividing the output frequency signal fout by the division ratio N. Following the control signals from the PFD circuit 14, the CP circuit 10 has the switches S31, S31b, S32, and S32b turn on and off. When these switching operations occur, the amount of electric charge transferred from the transistor M31 or the transistor M33 of the CP circuit 10 to the LPF circuit 16 is adjusted. This makes the voltage input into the VCO circuit 18 adjusted, and the output frequency signal fout that is output from the VCO circuit 18 is controlled. Therefore, the PLL circuit 12 in the present embodiment can output a high-frequency output frequency signal fout that is obtained by multiplying a low-frequency reference frequency signal fref.

Also, in the CP circuit 10 in the present embodiment, to adjust the output voltage Vout or the output frequency signal fout of the PLL circuit 12, when the transistor S31 switches from on to off, at the same time, the transistor S31b, which has its source connected with the source of the transistor S31, switches from off to on. Also, when the transistor S31 switches from off to on, at the same time, the transistor S31b switches from on to off. Similarly, when the transistor S32 switches from on to off, at the same time, the transistor S32b, which has its source connected with the source of the transistor S32, switches from off to on. Also, when the transistor S32 switches from off to on, at the same time, the transistor S32b switches from on to off.

When the switching occurs, before and after the switching, since the path of the current that flows in the transistor M31 switches between the transistor S31 side and the transistor S31b side on the downstream side of the transistor M31, a state is maintained where the current flows in the transistor M31. Or, since the path of the current that flows in the transistor M33 switches between the transistor S32 side and the transistor S32b side on the upstream side of the transistor M33, a state is maintained where the current flows in the transistor M33. Therefore, according to the present embodiment, when the switching occurs, the transistors M31 and M33 can be prevented from turning off, and hence, it is possible to improve followability of the transistors M31 and M33 for having a constant current flow through.

Also, in the CP circuit 10 in the present embodiment, the transistor M32 has its gate connected with the constant voltage source 61, and functions as a constant current source. Thus, when one of the transistors S31 and S31b turns on and the other turns off, even though the potential of the connection node C fluctuates due to the potential difference between the node A and the node B, the voltage Vgs between the gate and source of the transistor M32 virtually remains constant. Therefore, when one of the transistors S31 and S31b turns on and the other turns off, the CP circuit 10 can suppress fluctuation of the voltage Vds1 between both terminals of the transistor M31, and hence, can prevent the constant current that flows in the transistor M31 from fluctuating due to the fluctuation of the voltage Vds1 between both terminals of the transistor M31. Consequently, fluctuation of the output voltage Vout and the output frequency signal fout can be suppressed.

Similarly, in the CP circuit 10 in the present embodiment, the transistor M34 has its gate connected with the constant voltage source 63, and functions as a constant current source. Thus, when one of the transistors S32 and S32b turns on and the other turns off, even though the potential of the connection node D fluctuates due to the potential difference between the node A and the node B, the voltage Vgs between the gate and source of the transistor M34 virtually remains constant. Therefore, when one of the transistors S32 and S32b turns on and the other turns off, the CP circuit 10 can suppress fluctuation of the voltage Vds3 between both terminals of the transistor M33, and hence, can prevent the constant current that flows in the transistor M33 from fluctuating due to the fluctuation of the voltage Vds3 between both terminals of the transistor M33. Consequently, fluctuation of the output voltage Vout and the output frequency signal fout can be suppressed.

Also, according to the CP circuit 10 in the present embodiment, it is not necessary to adopt a feedback circuit that uses an operational amplifier and a phase compensation capacitor as illustrated in FIG. 1, to make the voltages of the node A and the node B equivalent to each other.

Since an operational amplifier always operates in an IC, it is a load that increases current consumption. Also, although a phase compensation capacitor is an element required for suppressing oscillation, it has the capacitance value of several dozen pF in general, and requires a large area in an IC. Therefore, according to the present embodiment, stability for outputting a current from the transistors M31 and M33 can be improved with a circuit having a simpler and more compact configuration than a circuit that adopts a feedback circuit using an operational amplifier and a phase compensation capacitor.

Although the charge pump circuit and the PLL circuit are described with the embodiments as above, the present invention is not limited to the above embodiments. Various modifications and improvements can be made within the scope of the present invention by combining and/or replacing a part of or all of the embodiments with the others.

The present application is based on Japanese Priority Application No. 2014-107422, filed on May 23, 2014, the entire contents of which are hereby incorporated by reference.

The invention claimed is:

1. A charge pump circuit, comprising:
    a constant current circuit configured to have one terminal connected with a power source node;
    a first node configured to input or output a current;
    a second node configured to be set to have a potential difference with the first node being less than or equal to a predetermined value;
    a first transistor configured to have one terminal connected with the first node;
    a second transistor configured to have one terminal connected with the second node, and to operate inverse to an operation of the first transistor; and
    a third transistor configured to be connected between a connection node, to which another terminal of the first transistor and another terminal of the second transistor are connected, and another terminal of the constant current circuit, wherein
    the third transistor has a gate connected with a constant voltage source, and functions as a constant current source, and
    the constant current circuit is a transistor configured to have a gate connected with a constant voltage source different from the constant voltage source connected with the gate of the third transistor.

2. The charge pump circuit, as claimed in claim 1, further comprising:
    a diode configured to be connected with the second node; and
    a current generation circuit configured to generate a greater constant current than that of the constant current circuit, and to have the constant current flow in the diode.

3. The charge pump circuit, as claimed in claim 2, wherein the current generation circuit includes a transistor configured to have a gate connected with the constant voltage source connected with the gate of the third transistor.

4. The charge pump circuit, as claimed in claim 2, wherein the diode includes a diode-connected transistor.

5. A charge pump circuit, comprising:
    a first constant current circuit configured to have one terminal connected with a first power source node;
    a second constant current circuit configured to have one terminal connected with a second power source node having a lower potential than that of the first power source node;
    a first node configured to input or output a current;

a second node configured to be set to have a potential difference with the first node being less than or equal to a predetermined value;

a first high-side transistor configured to have one terminal connected with the first node;

a first low-side transistor configured to have one terminal connected with the first node;

a second high-side transistor configured to have one terminal connected with the second node, and to operate inverse to an operation of the first high-side transistor;

a second low-side transistor configured to have one terminal connected with the second node, and to operate inverse to an operation of the first low-side transistor;

a third high-side transistor configured to be connected between a first connection node, to which another terminal of the first high-side transistor and another terminal of the second high-side transistor are connected, and another terminal of the first constant current circuit; and a third low-side transistor configured to be connected between a second connection node, to which another terminal of the first low-side transistor and another terminal of the second low-side transistor are connected, and another terminal of the second constant current circuit, wherein the third high-side transistor has a gate connected with a first constant voltage source, and functions as a constant current source, wherein the third low-side transistor has a gate connected with a second constant voltage source having a lower voltage than that of the first constant voltage source, and functions as a constant current source, the first constant current circuit is a transistor configured to have a gate connected with a third constant voltage source having a higher voltage than that of the first constant voltage source, and the second constant current circuit is a transistor configured to have a gate connected with a fourth constant voltage source having a lower voltage than that of the second constant voltage source.

6. The charge pump circuit, as claimed in claim 5, further comprising:

a diode configured to be connected with the second node; and a current generation circuit configured to generate a greater constant current than that of the second constant current circuit, and to have the constant current flow in the diode.

7. The charge pump circuit, as claimed in claim 6, wherein the current generation circuit includes a transistor configured to have a gate connected with the first constant voltage source.

8. A PLL circuit, comprising:

a phase frequency comparator configured to output a phase difference signal corresponding to a phase difference between a reference frequency signal and a predetermined frequency signal received as inputs;

the charge pump circuit, as claimed in claim 5, configured to have the first high-side transistor, the first low-side transistor, the second high-side transistor and the second low-side transistor operate, and to have an electric charge output from the first node, depending on the phase difference signal output from the phase frequency comparator;

a loop filter configured to accumulate the electric charge output from the charge pump circuit;

a voltage-controlled oscillator configured to oscillate at a frequency corresponding to a voltage generated by the electric charge stored in the loop filter, to output an output frequency signal obtained by multiplying the reference frequency signal by a predetermined ratio; and a frequency divider configured to divide the output frequency signal output from the voltage-controlled oscillator, by the predetermined ratio, and to output the predetermined frequency signal.

* * * * *